(12) United States Patent
Lee et al.

(10) Patent No.: US 6,617,700 B2
(45) Date of Patent: Sep. 9, 2003

(54) REPAIRABLE MULTI-CHIP PACKAGE AND HIGH-DENSITY MEMORY CARD HAVING THE PACKAGE

(75) Inventors: Joon-Ki Lee, Seoul (KR); Young-Hee Song, Kyungki-do (KR); Young-Shin Kwon, Chungcheongnam-do (KR)

(73) Assignee: Samsung Electronics Co., Ltd,, Suwon (KR)

( * ) Notice: Subject to any disclaimer, the term of this patent is extended or adjusted under 35 U.S.C. 154(b) by 0 days.

(21) Appl. No.: 09/923,669

(22) Filed: Aug. 6, 2001

(65) Prior Publication Data

US 2002/0031856 A1 Mar. 14, 2002

(30) Foreign Application Priority Data

Aug. 11, 2000 (KR) ..................................... 2000-046572

(51) Int. Cl.[7] ............................................... H01L 23/28
(52) U.S. Cl. ...................................... 257/787; 438/106
(58) Field of Search ................................ 438/106, 107, 438/108, 112, 125, 126, 127; 257/777, 704, 778, 787, 790

(56) References Cited

U.S. PATENT DOCUMENTS 5,148,265 A * 9/1992 Khandros et al. .............. 357/80
6,051,878 A * 4/2000 Akram et al. ................ 257/686
6,093,969 A * 7/2000 Lin ............................. 257/777
6,281,578 B1 * 8/2001 Lo et al. ..................... 257/724

* cited by examiner

Primary Examiner—David Nelms
Assistant Examiner—Thao P Le
(74) Attorney, Agent, or Firm—Marger Johnson & McCollom, P.C.

(57) ABSTRACT

Disclosed are a repairable multi-chip package and a high-density memory card having the multi-chip package. The package includes a circuit substrate having bonding tips on a first surface and external contact pads on a second surface opposite to the first surface. The bonding tips and the external contact pads are electrically connected to each other. The package also includes at least two memory chips each mounted on the first surface and having chip pads thereon. The package includes electrically connecting members coupling each bonding tip to each chip pad, and an encapsulation layer covering the chips and the electrically connecting members. Particularly, the encapsulation layer is divided into two or more parts, and the bonding tips are partially embedded in and partially exposed out of the divided encapsulation layer. Accordingly, the exposed bonding tips can be selectively cut or re-connected for repairing the multi-chip package. Additionally, a high-density memory card having the package is also disclosed.

14 Claims, 3 Drawing Sheets

REPAIRABLE MULTI-CHIP PACKAGE AND HIGH-DENSITY MEMORY CARD HAVING THE PACKAGE

BACKGROUND OF THE INVENTION

1. Field of the Invention

The present invention relates generally to a semiconductor integrated circuit device and, more particularly, to a reparable multi-chip package that can be used even though some defective chips are included in the package, and further to a high-density memory card having the repairable multi-chip package.

2. Description of the Prior Art

Digital devices, such as an MP3 phone, an MP3 player, a digital camera, and so on, typically use a memory card for read/write of data. The memory card includes a non-volatile memory chip such as a flash memory chip as a storage device. In recent years, new packaging technologies have been developed to increase the memory density of the memory card according to the trend toward enhanced integration and multi-functionality. As the needs of customers or buyers of high-density memory cards are ahead of the latest development in memory chip technology, a new solution using a multi-chip mounting technology has been proposed.

An exemplary multi-chip package of the prior art is shown in FIGS. 1A and 1B. As illustrated, the multi-chip package (10) contains two or more memory chips (13a, 13b) mounted on a single circuit substrate (11). Plural metallic wires (15), i.e., bonding wires, are provided for electrical connections between each memory chip (13a, 13b) and the substrate (11). That is, chip pads or bond pads (14) formed on the chips (13a, 13b) are coupled to one end of the wires (15), whereas bonding tips (12a, 12b) formed on the top surface of the substrate (11) are coupled to the other end of the wires (15). The bonding tips (12a, 12b) are electrically connected to external contact pads (17) formed on the bottom surface of the substrate (11) via through holes. The chips (13a, 13b), the wires (15), and the bonding tips (12a, 12b) are sealed in a mold layer (16).

The use of several memory chips (13a, 13b) gives the multi-chip package (10) an advantage of an increase in memory density of the memory card in comparison with a single-chip package.

However, the multi-chip package (10) has problems with yield. As well known in the art, the multi-chip package (10) should undergo various reliability tests for verifying the quality of each chip (13a, 13b) after packaging or assembling processes are completed. If any chip (13a, 13b) is ascertained to be defective with the tests, the entire multi-chip package (10) cannot be repaired or used since all the chips (13a, 13b) are sealed in the mold layer (16). Therefore, the multi-chip package has a yield loss greater than that of the single-chip package.

SUMMARY OF THE INVENTION

It is therefore an object of the present invention to provide a repairable multi-chip package. The multi-chip package is made available by a repair process after packaging processes even though some chips contained therein are defective.

Moreover, another object of the present invention is to improve the yield of the multi-chip package.

Still another object of the present invention is to provide a high-density memory card utilizing the repairable multi-chip package.

According to one embodiment of the present invention, a repairable multi-chip package includes a substrate, which has a plurality of bonding tips on a first surface thereof and a plurality of external contact pads on a second surface thereof. The bonding tips and the external contact pads are electrically connected to each other. The multi-chip package also includes at least two memory chips each of which is mounted on the first surface of the substrate and has a plurality of chip pads formed on a top surface thereof. The multi-chip package further includes a plurality of electrically connecting members, which couple respectively each bonding tip to a corresponding. Moreover, the multi-chip package includes an encapsulation layer, which covers the chips and the electrically connecting members. In particular, the encapsulation layer is divided into two or more parts, and the bonding tips are partially embedded in and partially exposed out of the divided encapsulation layer. Accordingly, the exposed bonding tips can be selectively cut or re-connected for repairing the multi-chip package and thereby for obtaining availability.

In another embodiment of the present invention, the memory chips may include at least one normal chip and at least one mirror chip, each of which has a symmetrical arrangement of the chip pads in comparison with the other chip. The normal chip and the mirror chip may be separately embedded in the parts of the divided encapsulation layer. In addition, the bonding tips may have central bonding tips disposed between the parts of the divided encapsulation layer, and the chip pads may have data input/output pads. The data input/output pads of both the normal chip and the mirror chip may be connected in common to the central bonding tips. Moreover, an electrically conductive material and a cutting tool are used for a selective re-connection and a selective cut of the bonding tips, respectively.

According to yet another aspect of the present invention, a high-density memory card includes the above-described repairable multi-chip package. The multi-chip package is accommodated in and joined to a base card by a joining member such as an adhesive to constitute the memory card.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

Figure 1A:
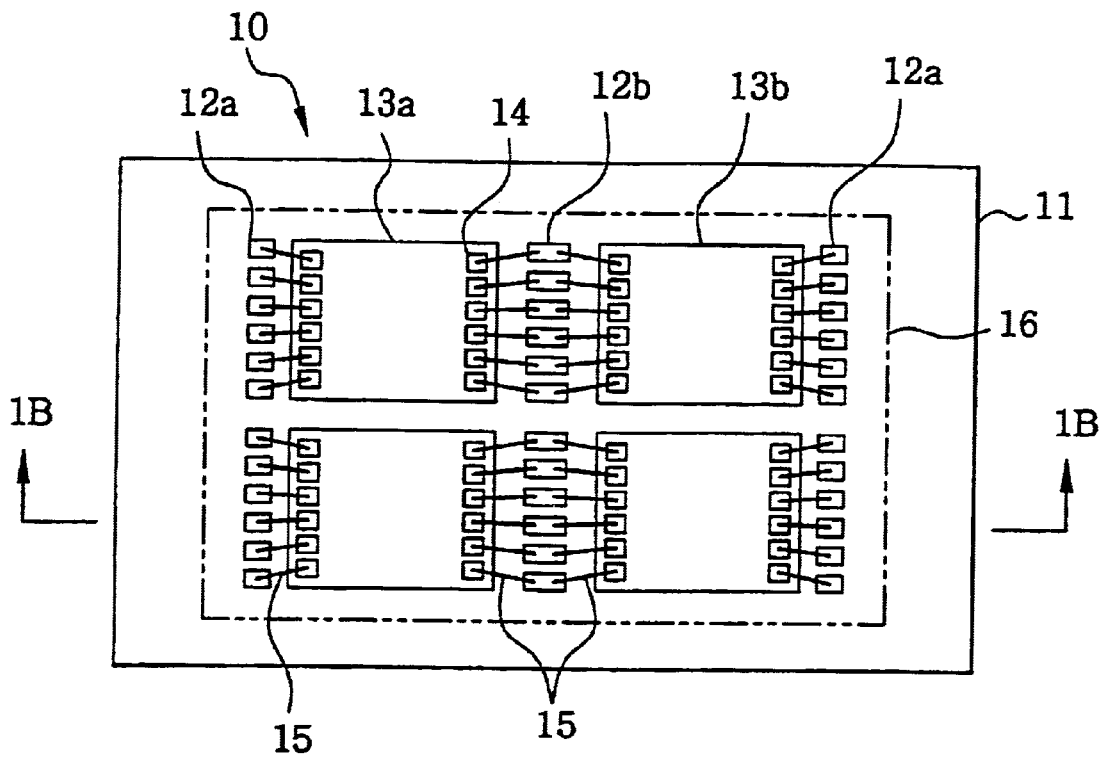
FIG. 1A is a plan view showing an example of a conventional multi-chip package.
Figure 1B:
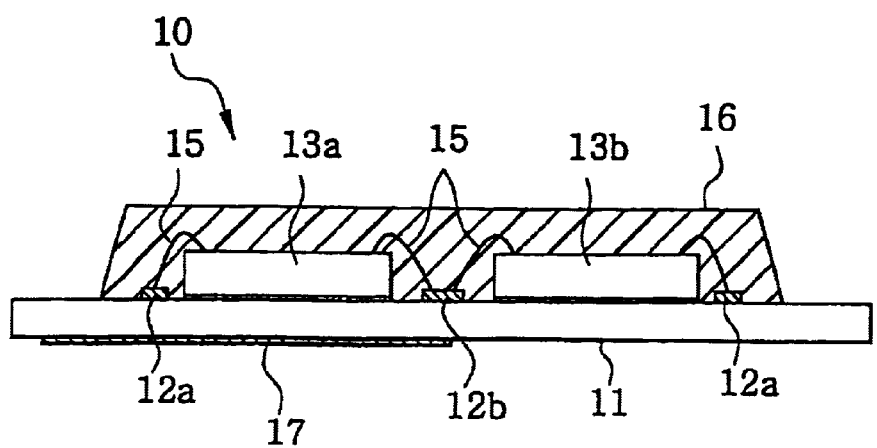
FIG. 1B is a cross-sectional view taken along the line 1B—1B in FIG. 1A.

The present invention will now be described more fully hereinafter with reference to accompanying drawings, as compared with the prior art. This invention may, however, be embodied in many different forms and should not be construed as limited to the embodiments set forth herein;

rather, these embodiments are provided so that this disclosure will be thorough and complete, and will fully convey the scope of the invention to those skilled in the art. In the drawings, like numbers refer to like elements throughout.

Figure 2A:
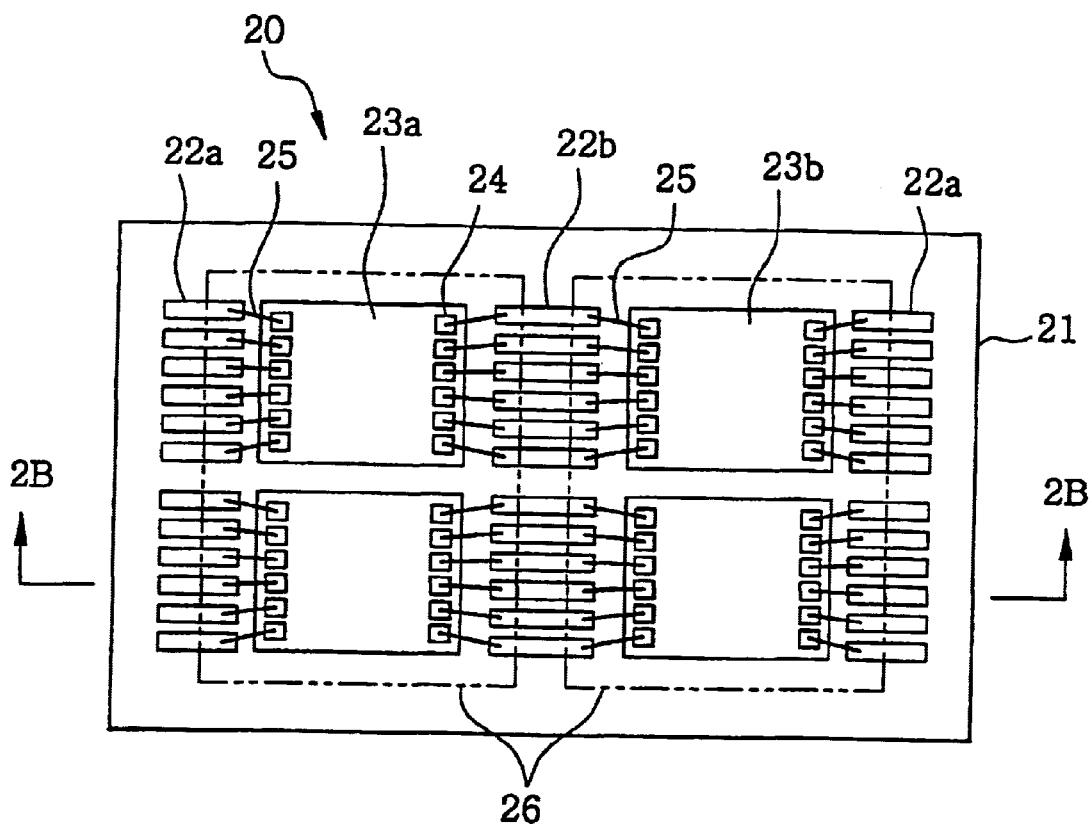
FIG. 2A is a plan view showing a repairable multi-chip package according to one embodiment of the present invention.
Figure 2B:
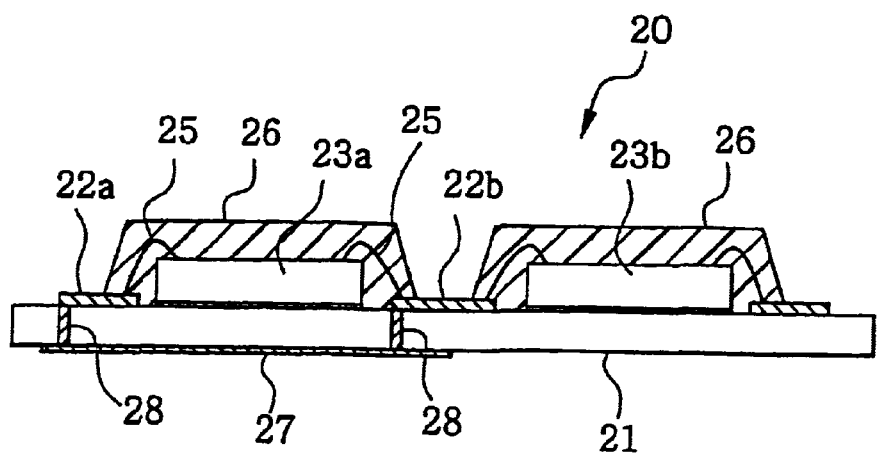
FIG. 2B is a cross-sectional view taken along the line 2B—2B in FIG. 2A.

FIGS. 2A and 2B show, in a plan view and a cross-sectional view, respectively, a repairable multi-chip package (20) according to the present invention. As shown in FIGS. 2A and 2B, the multi-chip package (20), also structuralized into a chip-on-board (COB) package, includes a plurality of semiconductor memory chips (23a, 23b) mounted on a single circuit substrate (21). Other types of packages well known in the art, such as a double density package (DDP) or a thin small outline package (TSOP), may be alternatively employed for the present invention, however, detailed explanations or illustrations of these packages will be omitted for the sake of simplicity.

In the multi-chip package (20), each memory chip (23a, 23b) has a plurality of chip pads (24), which are formed on the top surfaces of the memory chips (23a, 23b). The circuit substrate (21) has a plurality of bonding tips (22a, 22b), which are formed on the same surface as the memory chips (23a, 23b), and correspond to the respective chip pads (24). The circuit substrate (21) further has a plurality of external contact pads (27), which are formed on the reverse surface of the circuit substrate (20) and are electrically connected to their respective bonding tips (22a, 22b) through via holes (28). The memory chips (23a, 23b) are electrically coupled to the circuit substrate (21) by bonding wires (25), that is, each bonding wire (25) is bonded to the respective chip pad (24) at one end thereof and to each bonding tip (22a, 22b) at the other end thereof. Instead of the above-described wire bonding technique, other well-known techniques, such as tape automated bonding (TAB), anisotropic conductive film (ACF) bonding, or flip chip bonding, can be alternatively used for electrical connection between the chip (23a, 23b) and the circuit substrate (21).

The memory chip can be a normal chip (23a) or a mirror chip (23b). Since the mirror chip (23b) has a symmetrical arrangement of the chip pads (24) in comparison with the normal chip (23a), input/output data pads having the same function in both chips (23a, 23b) can be connected in common to bonding tips (22b) that are centrally arranged on the circuit substrate (21). Therefore, the required number of the bonding tips is reduced and their pattern becomes simplified. Preferably, the memory chip (23a, 23b) is a non-volatile memory chip such as a NAND-type flash memory device or a NOR-type flash memory device. For instance, four NAND-type flash memory devices or chips, each of which has a memory density of 256 Mb (mega bit), are employed to constitute a multi-chip package having a total memory density of 128 MB (mega byte).

The multi-chip package (20) in accordance with preferred embodiments of the present invention is characterized by an encapsulation layer (26) divided in two or more parts. The encapsulation layer (26) covers both the memory chips (23a, 23b) and the bonding wires (25) to protect them from an external hostile environment. Moreover, the encapsulation layer (26) is divided into two or more parts, each of which separately covers different chips. The encapsulation layer (26) is preferably a mold layer produced by a transfer molding method using an epoxy molding compound. For this method, a multi-cavity mold die equipped with several molding cavities and related gates may be used to form a divided mold layer. Alternatively, a potting or dispensing method with liquid encapsulants may be used for forming the divided encapsulation layer (26).

Another characteristic of the multi-chip package (20) lies in the bonding tips (22a, 22b) partially embedded within the encapsulation layer (26). That is, each peripheral bonding tip (22a) is embedded in the encapsulation layer (26) at one end, and extended past the outside of the encapsulation layer (26) at the other end. Each central bonding tip (22b) is embedded in the encapsulation layer (26) at both ends, and exposed at the gap separating the divided parts of the encapsulation layer (26). The partially exposed bonding tips (22a, 22b) enable a repair of the package if it is found to contain defective chips therein. Detailed descriptions of this process will follow later.

Figure 3:
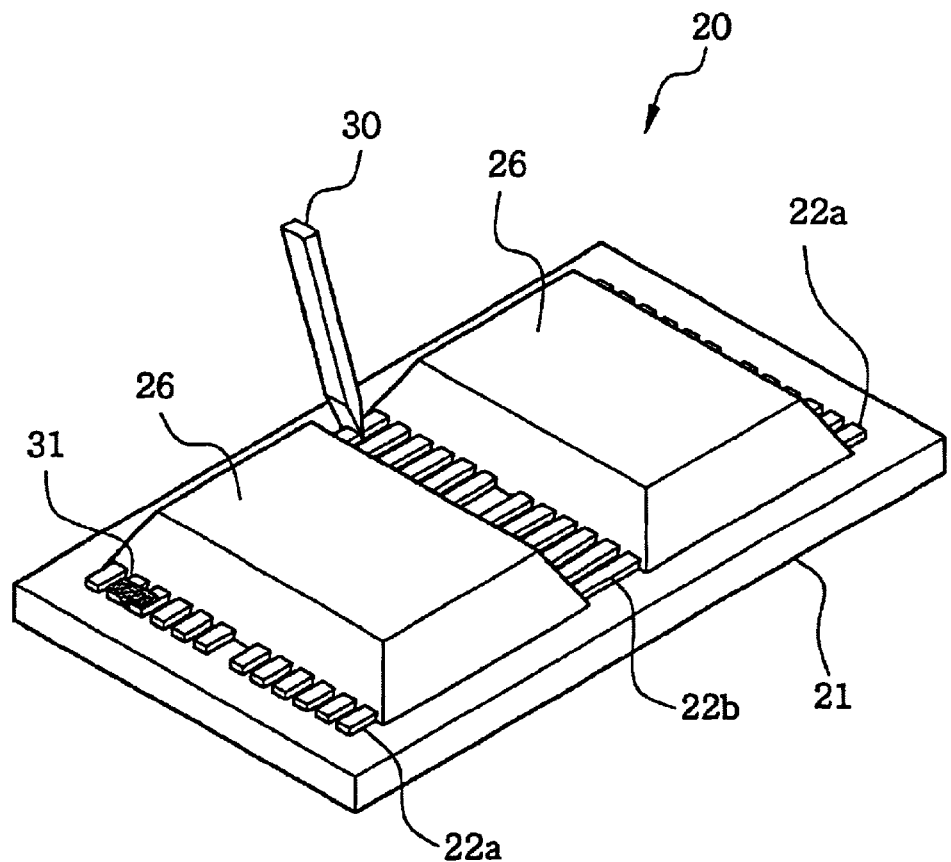
FIG. 3 is a perspective view illustrating a repair process for the multi-chip package shown in FIGS. 2A and 2B.

According to the present invention, the repairable multi-chip package (20) can be repaired after packaging or assembly. Referring to FIG. 3, the bonding tips (22a, 22b) extrude from the divided encapsulation layer (26). Therefore, it is possible to electrically and selectively isolate the defective chips by cutting the relevant bonding tips (22a, 22b) connected to the defective chips, or to reconstruct electrical connections between the good chips by selectively re-connecting the relevant bonding tips to each other. A cutting blade or a laser may be used as a cutting tool (30) for selectively cutting the bonding tips, while an electrically conductive material such as a silver-epoxy may be used as a connection member (31) for selectively re-connecting the bonding tips. The bonding tips (22a, 22b) have a thickness of approximately 30 to approximately 40 microns, allowing easier cutting of the bonding tips (22a, 22b). In addition, the conductive material is supplied in a liquid form and then cured.

The following paragraph explains how the repair method of the present invention for the multi-chip package is accomplished by cutting and re-connecting relevant bonding tips. Although specific pads among the chip pads are named, the invention is not so limited. Rather, the examples are merely meant to indicate to those skilled in the art how bonding tips may be cut and re-connected to repair multi-chip packages containing any set of memory chips connected in the fashion previously disclosed or similar fashions within the spirit and scope of the present invention. Therefore, all specific connections possible will be apparent to those skilled in the art.

In a multi-chip package having four 256 Mb NAND flash memory chips, if two chips are defective but two chips are good, an nCE pad of each defective chip is re-connected to a Vdd pad. In addition, an FCSADD0 pad of one good chip is re-connected to a Vdd pad, while an FCSADD1 pad of the good chip is cut. Furthermore, an FCSADD0 pad and an FCSADD1 pad of the other good chip, and F4CSM pads of both good chips are cut. By doing so, a 64 MB package is obtained. On the other hand, if three chips are defective but a single chip is good, an nEW pad of each defective chip is re-connected to a Vdd pad, whereas an FMULT1 pad, an FCSADD0 pad, an FCSADD1 pad, and an F4CSM pad of the good chip are cut. Thereby, a 32 MB package is obtained.

As previously explained, the partially defective multi-chip package can be repaired and therefore used, so that the yield of the package is improved and the competitiveness of the package is strengthened.

Figure 4:
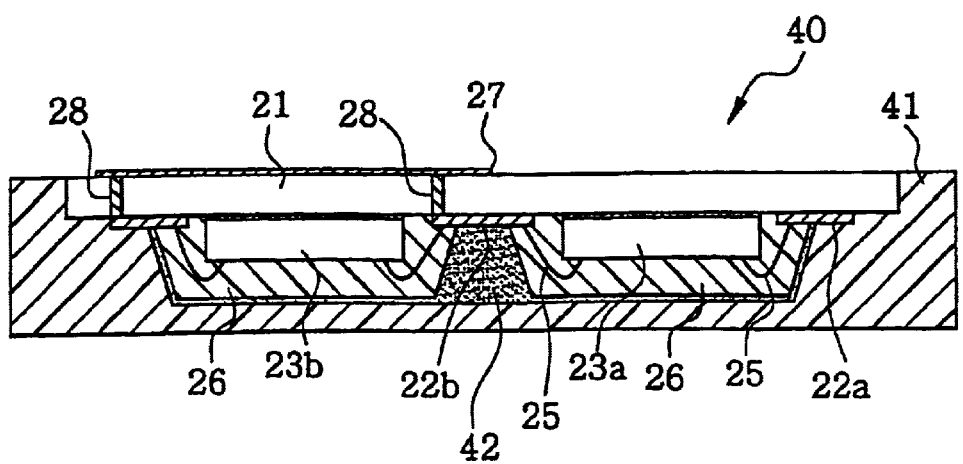
FIG. 4 is a cross-sectional view showing a high-density memory card according to another embodiment of the present invention.

The multi-chip package described above is preferably employed for a memory card (40). As depicted in FIG. 4, the multi-chip package (20) is accommodated in a base card (41) and then physically joined with a joining member (42) to constitute the memory card (40). A liquid adhesive, an adhesive tape, or an alternative member may be used as the joining member (42). The external contact pads (27) of the package face the outside of the memory card (40). Therefore, the external contact pads (27) can provide electrical paths between the memory card (40) and external electronic systems or devices when the memory card (40) is inserted into the external systems or devices such as MP3 players or digital cameras.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A multi-chip package comprising:
   a multi-chip package substrate including a first surface having a plurality of bonding tips formed thereon;
   at least two memory chips each mounted on the first surface of said substrate and having a plurality of chip pads formed on a top surface thereof;
   wherein each bonding tip is electrically connected to a corresponding chip pad; and
   an encapsulation layer covering said at least two chips, wherein said encapsulation layer is divided into two or more parts, each of said parts separately covering at least one of said memory chips to expose the bonding tips electrically connected therebetween, and wherein the bonding tips are partially embedded in and partially exposed out of the divided encapsulation layer so that the exposed bonding tips may be selectively cut or re-connected.

2. The multi-chip package of claim 1, wherein the substrate includes a second surface that is opposite to the first surface, and wherein the second surface has a plurality of external contact pads formed thereon and electrically connected to the bonding tips.

3. The multi-chip package of claim 1, wherein each part covers one of said memory chips.

4. The multi-chip package of claim 1, wherein said memory chips includes at least one normal chip and at least one mirror chip, each of which has a symmetrical arrangement of the chip pads in comparison with the other chip.

5. The multi-chip package of claim 4, wherein the normal chip and the mirror chip are separately embedded in the parts of said divided encapsulation layer.

6. The multi-chip package of claim 5, wherein the bonding tips include central bonding tips disposed between the parts of said divided encapsulation layer, wherein the chip pads include data input/output pads, and wherein the data input/output pads of both the normal chip and the mirror chip are connected in common to the central bonding tips.

7. The multi-chip package of claim 1, further comprising an electrically conductive material for selectively re-connecting the bonding tips.

8. The multi-chip package of claim 1, wherein the bonding tips include a cut bonding tip.

9. A multi-chip package comprising:
   a substrate including a first surface having a plurality of bonding tips formed thereon;
   at least two memory chips each mounted on the first surface of the substrate and having a plurality of chip pads formed on a top surface thereof;
   bonding tips electrically connected to chip pads; and
   a plurality of encapsulants each covering at least one of said chips, wherein the bonding tips are exposed between the encapsulants to repair the multi-chip package by selective cutting or re-connecting the bonding tips.

10. The multi-chip package of claim 9, wherein the substrate includes a second surface opposite to the first surface, the second surface having a plurality of external contact pads formed thereon and electrically connected to the bonding tips.

11. A multi-chip package comprising:
    a multi-chip package substrate having a top surface;
    at least two adjacent chips mounted on the top surface of the package substrate and each having a plurality of chip pads formed on a top surface thereof; and
    at least two adjacent encapsulants each covering at least one of the at least two adjacent chips, the at least two adjacent encapsulants having a gap therebetween separating the encapsulants.

12. The multi-chip package of claim 11, wherein the package substrate includes a plurality of bonding tips formed thereon.

13. The multi-chip package of claim 12, wherein each bonding tip is electrically connected to a corresponding chip pad.

14. The multi-chip package of claim 12, wherein the bonding tips are exposed at the gap separating the encapsulants to repair the multi-chip package by selective cutting or re-connecting the exposed bonding tips.

* * * * *